Figure 1:
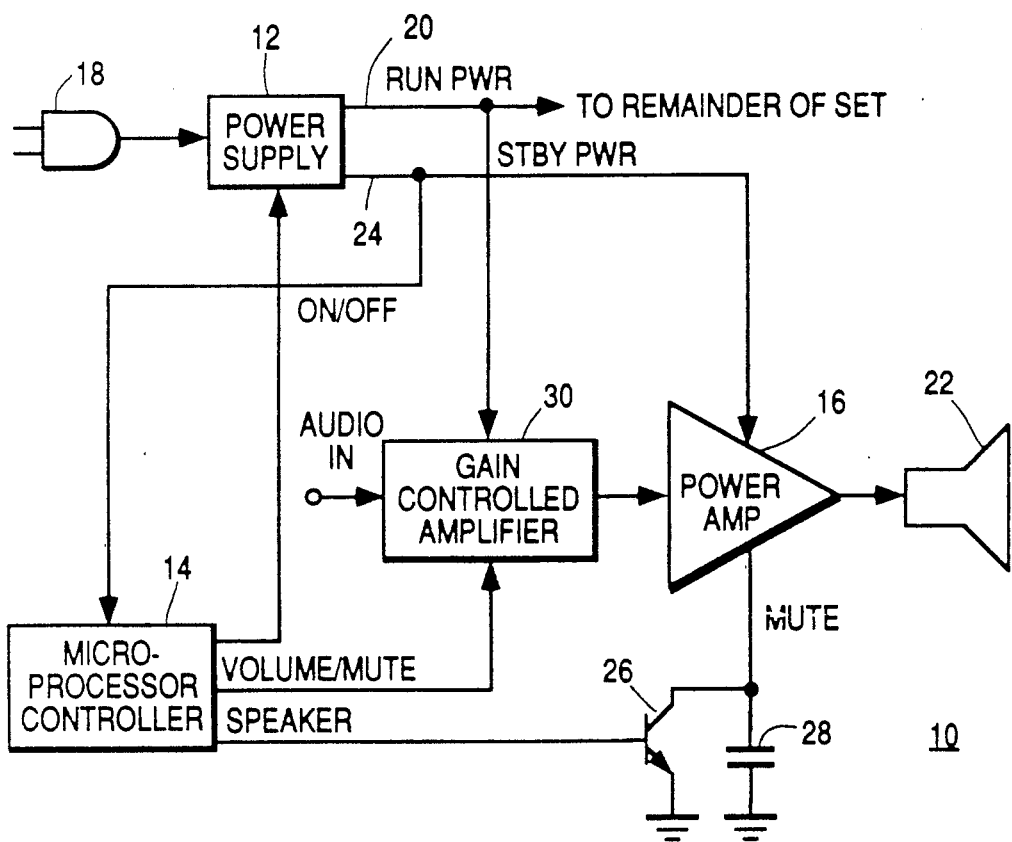

United States Patent [19]

Morris, Jr.

[11] Patent Number: 5,029,005
[45] Date of Patent: Jul. 2, 1991

[54] APPARATUS FOR THE MUTING OF AN AUDIO POWER AMPLIFIER IN A STANDBY MODE

[75] Inventor: Robert E. Morris, Jr., Indianapolis, Ind.

[73] Assignee: RCA Licensing Corporation, Princeton, N.J.

[21] Appl. No.: 511,295

[22] Filed: Apr. 25, 1990

[51] Int. Cl.⁵ .......................... H04N 5/60; H03F 1/26
[52] U.S. Cl. ................................... 358/165; 455/212; 330/51
[58] Field of Search ................... 330/51; 358/165, 198; 455/174, 194, 212, 218, 222, 295, 296, 298; 381/94, 107, 120, 123

[56] References Cited

U.S. PATENT DOCUMENTS

| | | | |
|---|---|---|---|
| 4,181,895 | 1/1980 | Yoshida | 330/279 |
| 4,366,442 | 12/1982 | Yamada | 330/51 |
| 4,383,136 | 5/1983 | Numata et al. | 179/1 |
| 4,395,734 | 7/1983 | Rypkema | 455/194 X |
| 4,405,948 | 9/1983 | Griffis | 358/198 |
| 4,427,949 | 1/1984 | Yamaguchi et al. | 330/51 |
| 4,433,306 | 2/1984 | Honda et al. | 330/297 |
| 4,435,684 | 3/1984 | Page | 330/51 |
| 4,438,527 | 3/1984 | Hammond | 381/107 |
| 4,441,086 | 4/1984 | Karlow et al. | 330/297 |
| 4,490,838 | 12/1984 | Nishioka | 381/15 |
| 4,491,800 | 1/1985 | Miyata | 330/51 |
| 4,531,089 | 7/1985 | Ishizuka | 324/99 |
| 4,532,457 | 7/1985 | Haferl | 315/411 |
| 4,542,421 | 9/1985 | Fujibayashi | 360/67 |
| 4,543,539 | 9/1985 | Seki et al. | 330/297 |
| 4,555,730 | 11/1985 | Briggs | 358/142 |
| 4,568,979 | 2/1986 | Takagi | 358/165 |
| 4,581,541 | 4/1986 | Nakayama et al. | 307/243 |
| 4,600,947 | 7/1986 | Chamberlain et al. | 358/165 |
| 4,627,101 | 12/1986 | Anderson et al. | 455/194 |
| 4,628,539 | 12/1986 | Selwa | 455/194 |
| 4,633,495 | 12/1986 | Schotz | 381/107 X |
| 4,638,507 | 1/1987 | Palara et al. | 381/120 X |
| 4,641,190 | 2/1987 | Testin | 358/165 |
| 4,673,889 | 6/1987 | Cini et al. | 330/10 |
| 4,748,667 | 5/1988 | Schmitz | 307/112 |
| 4,788,508 | 11/1988 | Kawai | 330/51 |
| 4,837,623 | 6/1989 | Motoyama | 358/165 |
| 4,903,334 | 2/1990 | Anderson | 358/165 X |

OTHER PUBLICATIONS

NEC Corp. of Japan Data Sheets for uPC1188H Integrated Circuit Audio Power Amplifier.

Primary Examiner—Howard W. Britton
Assistant Examiner—Mark R. Powell
Attorney, Agent, or Firm—Joseph S. Tripoli; Peter M. Emanuel; Frederick A. Wein

[57] ABSTRACT

In a television receiver apparatus is provided for muting an audio power amplifier having continuous operating supply voltage applied thereto from a standby power supply even when the receiver is in an "off" condition so that spurious noise and hum coupled to the power amplifier will not be amplified and heard by the viewer. The muting is applied via a microprocessor controller which controls and senses the power supply status of the receiver as well as mutes the power amplifier in both the "off" and the "on" conditions.

7 Claims, 3 Drawing Sheets

APPARATUS FOR THE MUTING OF AN AUDIO POWER AMPLIFIER IN A STANDBY MODE

The present invention concerns apparatus for "muting" an audio power amplifier to suppress noise and other audible signals in a television receiver during a low power condition. In such an "off" condition, almost all portions of the television receiver are de-energized. However, according to aspects of the present invention, the audio power amplifier, as well as the remote control responsive microprocessor and associated infra-red sensing circuit continue to receive standby power.

An audio signal processing system often includes provision for controlling the amplitude of audio signals processed by the system to thereby control the volume of audio information reproduced by a loudspeaker associated with the system. In many signal processing systems, the audio volume can be conveniently controlled by means of an electronic signal attenuator, e.g., comprising gain controlled amplifier, which responds to a variable DC gain control voltage representing the desired volume. The volume control voltage is commonly derived from a user adjustable volume control arrangement, e.g., including a potentiometer or microprocessor controlled digital-to-analog converter.

In remote controlled television receivers, it is necessary to maintain a low-power standby power supply active when the set is in the "off" condition in order that the microprocessor, which controls the "on-off" condition of the power supply can be activated to turn the receiver "on" in response to a command signal from the remote control transmitter. In addition to such a commonplace arrangement, as disclosed in detail below with respect to the preferred embodiment of the present invention, the power audio amplifier driving the loudspeakers may also have a power supply voltage continuously applied to it even though the rest of the television receiver is de-energized when power is switched off. This is done so that a switch between the power supply and power amplifier is not necessary. This is desirable because audio power amplifiers require considerable current relative to the rest of the receiver and a switch for switching the current would have to be relatively substantial and therefore more costly. This concern is even more crucial in a television receiver capable of stereophonic sound reproduction requiring at least two power amplifiers.

Among the components which lose power in the "off" condition are the electronic signal attenuator and the volume control portions. The present invention is directed in part to the recognition that without power being supplied thereto, these components no longer act according to the control function they provide during the "on" condition. More specifically, in the "off" condition, these components are able to pick up spurious signals, such as noise and hum signals, which can be coupled to the still active power amplifier. These spurious signals can cause an an output signal to be coupled from the power amplifier to the loudspeakers resulting in objectionable audible responses even when the receiver is supposedly "off".

Briefly, according to the invention, a system is provided for "muting" the audio power amplifier having continuous operating supply potential applied thereto so that spurious noise and hum coupled to the power amplifier when the television receiver is in a low-power "off" condition will not be amplified and thereby heard by the viewer. Specifically, a power amplifier muting signal is generated by a microprocessor controller, which controls the power supply status of the receiver, and is coupled to the power amplifier when the receiver is in the "off" condition. In the preferred embodiment, the same arrangement is also used to mute the power amplifier in the "on" condition to effectively disconnect the speaker, e.g., when an external audio source and associated speaker is utilized.

According to another aspect of the invention, the power amplifier muting signal also causes the power amplifier to reduce its power consumption during the "off" condition.

Figure 2A:
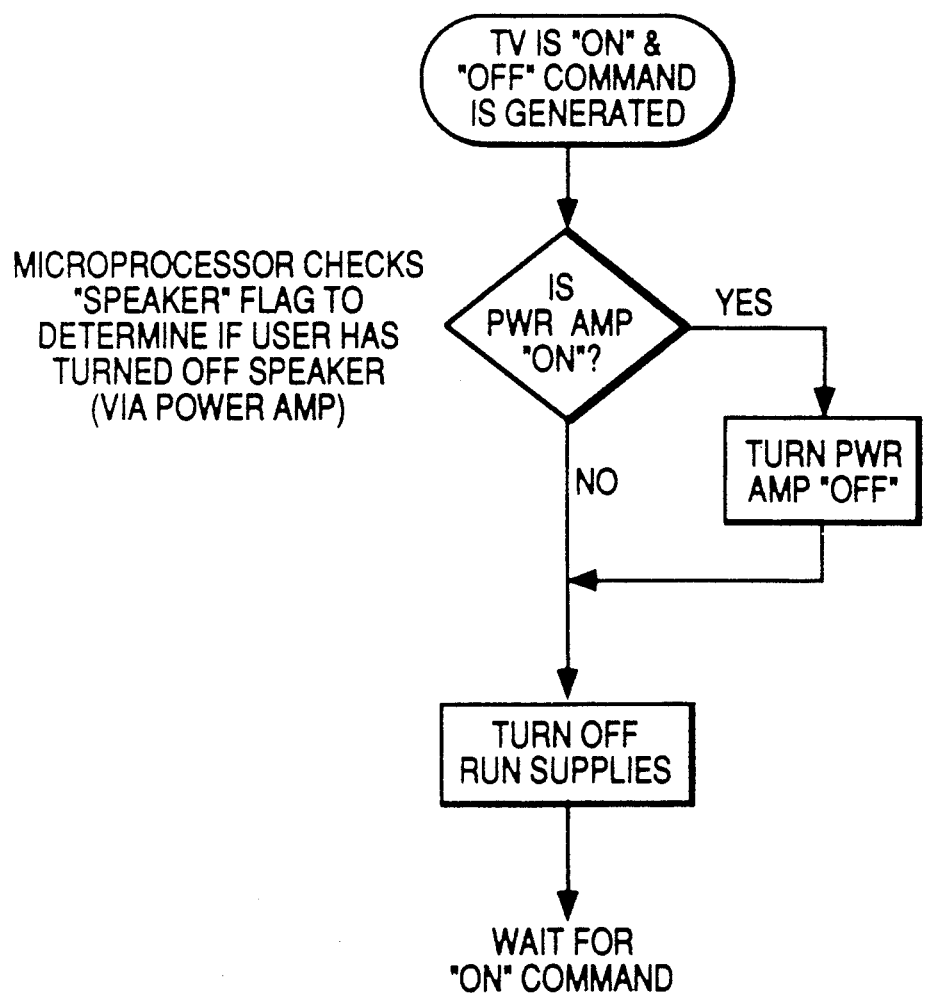
Figure 2B:
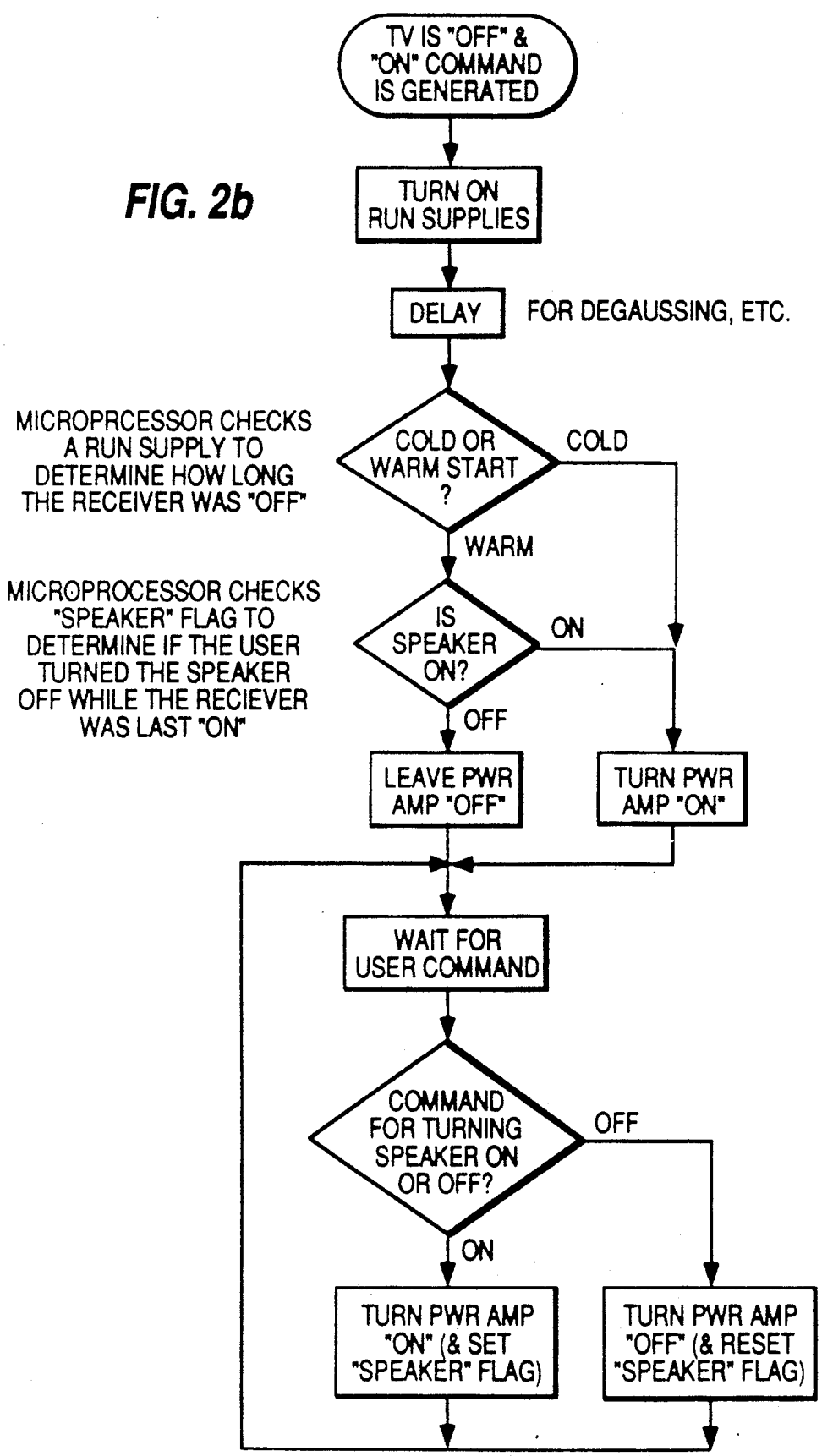

During the following description of the preferred embodiment of the invention, reference should be made to the accompanying drawings, wherein:

FIG. 1 illustrates, in block diagram form, the noise suppression network of a television receiver according to an aspect of the present invention; and FIGS. 2a and 2b show flow charts illustrating the operation of the controller shown in FIG. 1.

In the FIGURES, like members are identified by like reference numbers.

The following information is helpful in understanding the principals of the preferred embodiment of the invention to be subsequently described.

Remote controlled television receivers have a "standby" power supply that operates constantly in the low-power "off" condition of the receiver as long as the receiver is plugged in to the utility power source and there is no power "drop-out". They also have a full power "run" supply which is used when the receiver is switched to "on". In the low power "shut-off" mode, almost all portions of the receiver are deenergized.

The power supply operates in a low power condition when only standby supply voltages are generated and in a high power condition when both the standby and run supply voltages are provided. The power supply typically derives run supply voltages directly from the deflection or flyback voltages in a conventional manner as ultimately derived from the AC line. This is exemplified in the discussion of power supplies found at pages 324, 325 of "Basic Television and Video Systems", Fifth edition, by Grob, McGraw-Hill Book Company, copyright 1984. Standby power is derived from the AC line voltage independent of the deflection power which is shut-off in the standby mode.

However, the amount of power drawn by the audio power amplifier can be so great as to cause the deflection signals to be adversely affected, thereby distorting the electron beam scanning of the CRT. Therefore to avoid such adverse affects of the power drawn by the audio amplifier on the deflection signals, the power supply voltage for the audio amplifier in the exemplary embodiment is drawn from the standby power supply. Since the standby supply voltage is not turned off when the set is in the "off" condition, a switch would ordinarily be required to disconnect the standby power supply from the audio power amplifier when the receiver is in the "off" condition. Thus, according to an aspect of the present invention, the audio power amplifiers are continually energized directly from the standby power supply because it is desirable that this relatively considerable power for the audio power amplifiers not be switched "on" or "off" by a low/power electronic power commonly used in television receivers.

However, it is herein recognized that problems can arise when the receiver is in the low-power "shut-off"

condition and the audio power amplifiers are still active. In such a situation, the gain control circuits coupled to the power amplifiers are also switched "off" and are "free floating" so that uncontrolled pickup of hum and noise can result. As a result, undesirable audible sound may be produced at a time when the viewer expects the receiver to be "off". Additionally, it is undesirable for the amplifiers to draw power in the standby mode.

In a television receiver with remote control provision, the control microprocessor controller is constantly supplied from the standby power supply since the controller must have the capability to constantly responding to remote control commands from the remote control transmitter in order to switch the receiver "on" from an "off" condition.

Television sets which have remote control provisions often provide a remote muting function by which a viewer can mute the reproduced sound from a remote viewing position while the picture continues to be shown. This mute function may operate in a manner similar to the volume control circuitry by reducing the gain of a controllable gain amplifier prior to the power amplifier. This mute control function is sometimes associated with the volume control function. In addition to this conventional mute control function, it is desirable to provide apparatus by which the user may electronically disconnect the internal speakers of the receiver, e.g., to suppress noise when an external audio source and associated speakers are utilized. This "speaker disconnect" function can be accomplished, as in the present embodiment, by muting the power amplifiers.

The microprocessor for remotely switching the receiver "on" and "off" by way of control of the electronic power supply switch, also controls both the conventional volume mute functions and the power amplifier mute function. Specifically, since the mute control microprocessor is always energized, it is herein recognized that the microprocessor is also available for muting the audio power amplifiers during the "off" power supply condition in order to overcome the noise and hum problem previously discussed.

Referring now to the preferred embodiment shown in FIG. 1, television receiver 10 includes a power supply 12, a microprocessor controller 14, an audio power amplifier 16, a speaker 22, and a gain controlled audio amplifier 30. Power supply 12 derives the various supply voltages required for operation of the receiver from the AC line source, symbolically represented by plug 18. The power supply voltages are shown symbolically indicated by line 20 labeled "run power" and by line 24 labelled "standby power". Standby power, represented by line 24 is constantly applied to power amplifier 16 and to microprocessor controller 14. When the television receiver is switched into an "off" condition, all the "run" power supply voltages are disconnected from the respective portions of receiver 10. However, the "standby" power supply voltages continue to be provided. The switching of the power supply between "on" (run) and "off" (standby) conditions is controlled by microprocessor controller 14 in response to user initiated commands provided either from the front panel (not shown) of the receiver or from the wireless infra-red remote control transmitter. The so called "TELEKAT" television control IC including a microprocessor available from Motorola, Inc., is suitable for use as a microprocessor controller 14.

Television receiver 10, as is conventional, includes video and audio channels. The video channels will not be described since the present invention concerns the audio channel.

The audio channel includes a gain controlled amplifier 30, audio power amplifier 16 and speaker 22 coupled in cascade in conventional fashion. An audio signal is coupled to the input of gain controlled amplifier 30 from a source (not shown) and successively amplified by gain controlled amplifier 30 and audio power amplifier 16 to produce an audio signal suitable for driving speaker 22. It will be appreciated, that in a television receiver capable of stereophonic sound reproduction, that the arrangement shown in FIG. 1 is used twice, once for each of the left and right audio signals and the source of audio signals is a stereo decoder.

In the normal or "on" mode, the audio volume is controlled by controlling the gain of audio amplifier 30. A DC volume control signal generated by controller 14 is coupled to gain controlled amplifier for this purpose. The audio response may also be "muted" whereby the audio response is reduced to zero by setting the DC control signal. The audio response is muted in response to a user initiated "mute" command. The audio response may also be muted whenever the turner (not shown), also controlled by controler 14, is caused to change channels. A suitable gain controlled audio amplifier is contained in the M50573 stereo processing IC available from Mitsubishi Corporation of Japan.

In addition, it is possible for a user to effectively disconnect speaker 22 (speakers in the case of stereo), e.g., when an external audio source (such as a VCR) and an external speaker are utilized, in response to a user initiated command. This is also accomplished under the control of controller 14. A "flag" register in controller 14 is "set" to a logic "1" when speaker 22 is connected and reset to a logic "0" when speaker 22 is disconnected.

Specifically, the "speaker disconnect" function is accomplished by controller 14 controlling the conductive state of a transistor 26 coupled across a capacitor 28. Capacitor 28 is coupled to the muting input pin of power amplifier 16. In the normal operational or "on" condition of the receiver, transistor 26 is non-conductive thereby permitting capacitor 28 to charge up with respect to ground so that the mute pin of the IC is high and the amplifier actuates. In a power amplifier mute condition, transistor 26 is switched "on" in response to a "speaker disconnect" signal generated by controller 14 and capacitor 28 is discharged so that the mute pin of the IC is low causing the amplifier to be switched into its "low-power" muted state. This effectively disconnects speaker 22. This not only mutes the reproduced sound, but also switches "off" the current drawn by the power amplifier. The μPC 1188 audio power amplifier IC available from NEC Corporation of Japan is suitable for use as power amplifier 16.

In the "shut-off" standby power mode, amplifier 30 and volume control 32 are de-energized and are unable to function as intended in their energized mode. In such a situation, the components are floating and are susceptible to picking up noise, hum, or other spurious interference. Power amplifier 16 will amplify such sounds, and loudspeaker 22 would not be totally silent. According to the present invention, this problem is overcome by controller 14 initiating the power amplifier muting of transistor 26 when power supply 12 is switched to the standby mode. Additionally because of the manner of muting by placing a shunt across capacitor 28, current drawn by amplifier 16 from standby power supply 24 in the standby position is also reduced without requiring an electronic switch to do the switching.

The operation of the controller 14 is shown in greater detail in the flow charts of FIGS. 2a and 2b. For the most part, the flow charts are self explanatory. However a few salient points are particularly noteworthy.

In the flow chart shown in FIG. 2a, it is noted that microprocessor controller 14 checks the status of the "speaker (disconnect)" flag when a user turns the receiver "off", and turns off the power amplifier, by means of the speaker disconnect control signal, if the user has not already done so while the receiver was "on".

In the flow chart shown in FIG. 2b, it is noted that, after an "on" command is received, microprocessor controller 14 provides a delay in which the picture tube is degaussed, as is known, before determining future action. Thereafter, controller 14 determines if the receiver has been "off" long enough to consider the turn on procedure a "cold start" or a "warm start". A "cold start" occurs when the receiver has been off long enough so that the standby power supply has been substantially discharged. This can occur the first time the receiver is turned on by the customer after plug-in or when the receiver has been unplugged for a long enough time to discharge the standby supplies after the initial cold start so that the controller 14 has no stored conditions from a previous use. A "warm start" is any subsequent turn-on after the initial first time turn-on or when the standby power supply is not fully discharged such as when there is a temporary AC power failure or "dropout".

The charge status of the standby power supply may be determined by whether or not a "reset" signal is generated by a "reset" circuit (not shown). The "reset" signal is developed when the standby supply discharges to the point that the memory of controller 14 is lost. When this occurs, a warm start, by definition, is impossible since the last-used conditions are lost.

For a cold start condition, it is assumed that the user wants speaker 22 "connected". Accordingly, for a cold start condition, power amplifier 16 is turned on, whether or not the user previously caused speaker 22 to be connected.

On the other hand, for a warm start condition, the status of the "speaker (disconnect)" flag is checked. If the user previously caused speaker 22 to be "disconnected", power amplifier 16 is left "off". Conversely, if the user previously caused speaker 22 to be "connected", power amplifier 16 is turned "on".

Thereafter, microprocessor 14 waits for user commands, e.g., from the remote control transmitter. If a "speaker" command is generated, microprocessor 14 causes power amplifier 16 to be turned "on" or "off" according to the specific speaker command, and the "speaker" flag is set or reset accordingly for future reference.

As used herein, television receiver is intended to include any television signal processor such as a VCR or monitor, with or without a display device such as a CRT.

What is claimed is:

1. In a television system having a power supply having a relatively low power mode when said receiver is in an "off" condition, and a relatively high power "on" mode, apparatus comprising:
   audio power amplifier means for driving a loudspeaker having a power supply voltage constantly coupled thereto from said power supply as long as AC line power is provided to said power supply, and
   muting means for muting the power amplifier in order to prevent audio signals from being fed to the loudspeaker when the television system is in the "off" condition.

2. The television receiver of claim 1 wherein the muting means comprises microprocessor control means for generating a power amplifier muting signal when said receiver is caused to be in said "off" condition, said microprocessor means also being responsive to a user initiated command when said television system is in the "on" condition for generating the power amplifier muting control signal.

3. A television receiver having an audio power amplifier for driving a loudspeaker wherein an actuated power supply source remains coupled to the power amplifier when the receiver is in an "off" condition.

4. In a television system having a power supply having a relatively low power mode when said receiver is in an "off" condition, and a relatively high power mode "on" condition comprising:
   audio power amplifier means for driving a loudspeaker having a power supply voltage constantly coupled thereto from said power supply as long as AC line power is provided to said power supply, and
   muting means for muting the power amplifier in order to prevent audio signals from being fed to the loudspeaker and also for reducing the current drawn by the audio power amplifier from the power supply when the television system is in the "off" condition.

5. In a television system having a power supply having a relatively low power mode when said receiver is in an "off" condition, and a relatively high power "on" mode comprising:
   audio power amplifier means for driving a loudspeaker having a power supply voltage constantly coupled thereto from said power supply as long as AC line power is provided to said power supply, and
   muting means for muting the power amplifier in order to prevent audio signals from being fed to the loudspeaker and also for reducing the current drawn by the audio power amplifier from the power supply when the television system is in the "off" condition, the muting means comprising microprocessor control means for generating a power amplifier muting signal when said receiver is caused to be in said "off" condition, said microprocessor means also being responsive to a user initiated command when said television system is in the "on" condition for generating the power amplifier muting control signal.

6. A television system having a main power supply which can be turned "on" and "off" comprising:
   audio power amplifier means having an output terminal connectable to a loudspeaker,
   first control means for actuating and deactuating the loudspeaker to the output terminal responsive to a user command,
   second control means for turning the main power supply "on" and "off" in response to a user command, the power supply being able to be turned "on" in one of a "cold start" and a "warm start" mode, and means for determining whether the loudspeaker had been connected or disconnected to the output terminal by the first control means during the last previous power supply "on" condition, the first control means actuating said loudspeaker in response to either one of a "cold start" turn "on" and a determination that the loudspeaker had been connected to the power amplifier output terminal during the last previous power supply "on" condition, and not actuating the loudspeaker after a "warm start" turn "on" and a determination that the loudspeaker had been deactuated during the last previous power supply "on" condition.

7. The television system of claim 6 wherein the power amplifier is energized from a standby power supply which is operative even when the main power supply is in the "off" condition, and the first control means actuates the loudspeaker by coupling the standby power supply to the power amplifier and deactuates the loudspeaker by decoupling the standby power supply from the audio power amplifier.

* * * * *